United States Patent [19]

Sawada et al.

[11] 4,163,227
[45] Jul. 31, 1979

[54] APPARATUS FOR MONITORING ARCING OF BRUSHES IN A DYNAMOELECTRIC MACHINE

[75] Inventors: Fred H. Sawada, Scotia; Frank M. Klementowski, Saratoga Springs; James S. Bishop, Schenectady, all of N.Y.

[73] Assignee: General Electric Company, Schenectady, N.Y.

[21] Appl. No.: 901,579

[22] Filed: May 1, 1978

[51] Int. Cl.² ............................................. H02K 11/00
[52] U.S. Cl. ................................. 340/662; 322/58; 322/99; 328/165; 361/2; 361/20
[58] Field of Search ............... 340/662; 320/196, 220, 320/221; 322/58, 99, 100; 324/158 MG; 361/2, 20; 328/165, 167

[56] References Cited

U.S. PATENT DOCUMENTS

| | | | |
|---|---|---|---|
| 3,371,266 | 2/1968 | Davidson | 361/20 |
| 3,381,210 | 4/1968 | Shand | 322/100 |
| 3,653,019 | 3/1972 | Barton | 340/662 |
| 4,058,804 | 11/1977 | Sawada | 340/662 |

*Primary Examiner*—David L. Stewart

*Attorney, Agent, or Firm*—John F. Ahern; Ormand R. Austin; James W. Mitchell

[57] ABSTRACT

Apparatus is described for monitoring arcing of brushes used in the transfer of current signals to and from the field of a generator. Electrical signals from the brushes, which are applied to the disclosed monitor for analysis, may include brush arcing signals to be monitored and in addition high-amplitude noise spikes in the same frequency band as the brush arcing signals, the noise spikes thus masking accurate detection of low level brush arcing by conventional devices. A two-stage clipping network is provided in the monitor to raise the brush arcing/noise ratio and thus mitigate the masking effect of the noise spikes without loss of a portion of sampling interval during which arcing may occur. Other features described as part of the brush monitor are discriminator diodes biased for constant threshold sensitivity to maintain arc detection accuracy over a wide range of ambient temperatures; an alarm system which functions to indicate and record the occurrence of brush arcing so that corrective action may be initiated to prevent serious damage to rotor slip rings and brush components; and a reference signal generator which automatically adjusts the level of reference signal used in the alarm system for changes in generator noise level.

11 Claims, 10 Drawing Figures

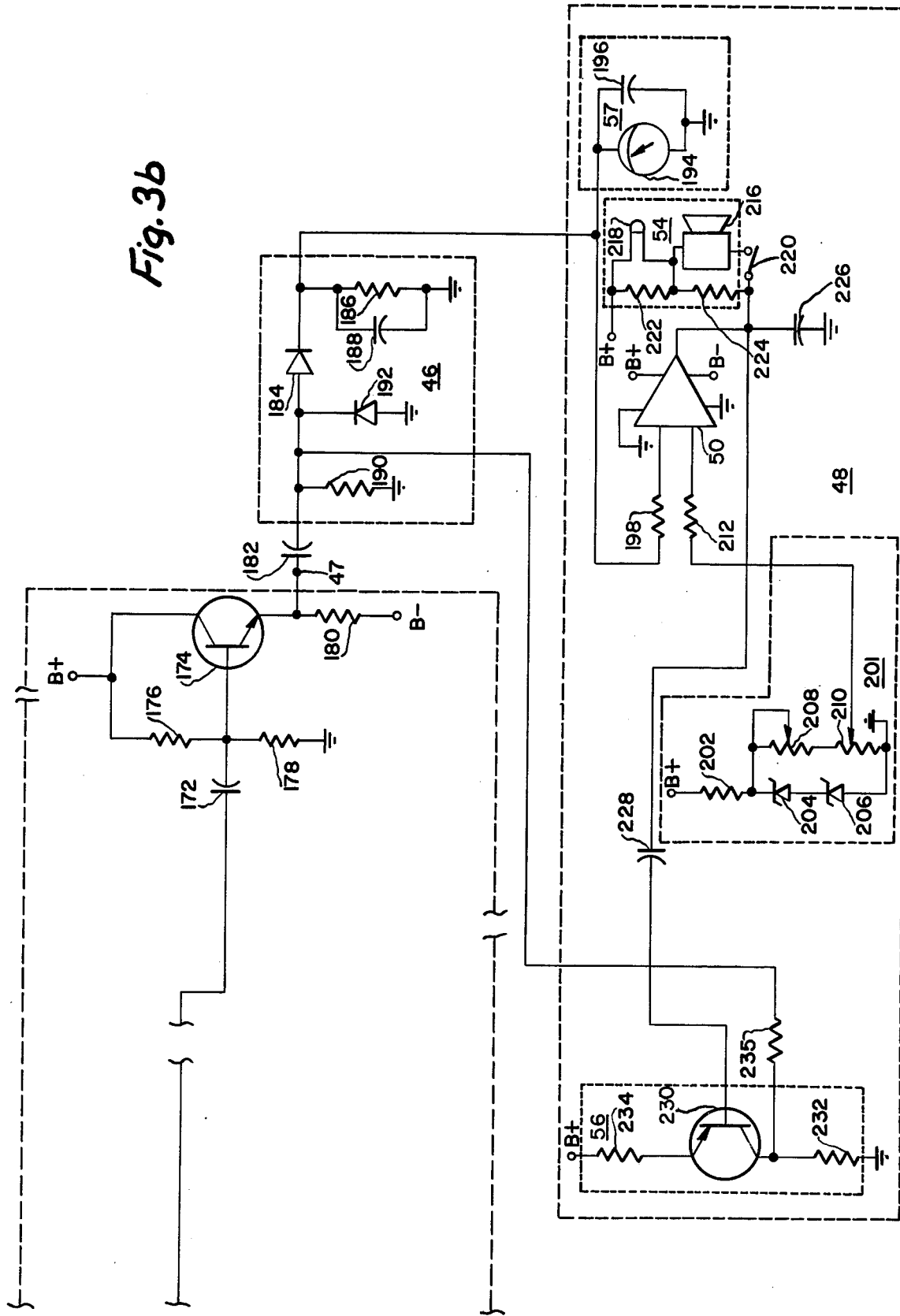

APPARATUS FOR MONITORING ARCING OF BRUSHES IN A DYNAMOELECTRIC MACHINE

BACKGROUND OF THE INVENTION

This invention relates to signal processing systems and more particularly to apparatus for monitoring arcing of brushes in a dynamoelectric machine.

In dynamoelectric machines such as a turbine-driven generator, brushes are used to conduct current to and from collector slip rings or commutators mounted on a rotor. Because of factors such as brush wear or misalignment, slip ring imperfections, or rotor vibrations, arcing may occur between brushes and the rotating slip ring or commutator surface against which the brushes bear during operation. This brush arcing, even if of low voltage potential, may cause deterioration of slip ring surfaces and may, if undetected and corrective action not taken, lead to excessive arcing and considerable damage to slip rings and brushholder riggings, forcing generator outages and expensive repairs. Monitoring of brush arcing is hence of considerable importance, yet accurate detection of brush arcing, particularly low levels thereof, has proven of considerable difficulty in certain generators due to the presence of high-amplitude noise spikes resulting, for example, from commutation of diodes and silicon-controlled rectifiers in the excitation system of the generator and appearing in the same frequency band as the brush arcing to be monitored.

U.S. Pat. Nos. 3,653,019 to Barton et al and 4,058,804 to Sawada et al, assigned to the assignee of the present invention and whose disclosures are incorporated herein by reference thereto, describe systems for monitoring generator brush arcing which eliminate the high-amplitude noise spikes from a composite signal including brush arcing signals and noise spikes through the use of a pulse-forming network and gating network. The pulse-forming network of these inventions reacts to a noise spike by producing a disabling signal which when applied to the gating network blocks passage of the composite signal therethrough for a predetermined time period at least equal to the duration of the noise spike, and (in the case of the improved system of U.S. Pat. No. 4,058,804) passes the composite signal through the gating network at all other times for subsequent detection of brush arcing signals.

While the inventions set forth in these patents greatly facilitate measurement of brush arcing, the gating concept used therein may cause the systems of U.S. Pat. Nos. 3,653,019 and 4,058,804 to miss or fail to detect some brush arcing signals of potential importance to generator performance and durability. This deficiency occurs because in blocking the composite signal from passage through the gating network for the period of the noise spike and its associated ringing, these systems also block any brush arcing signals occurring during this time interval and hence preclude detection thereof. Since the high-frequency noise spikes may occur at frequent intervals, the "arc detection" time lost due to the blocking pulses can represent a significant percentage of the total time interval monitored, e.g., up to 40 percent, and thus the probability of detecting harmful arcing may be less than desired.

The signal monitor of the present invention overcomes this deficiency by mitigating the effect of the noise spikes without the use of blocking pulses or a gating system and permits accurate detection of a wide range of brush arcing signals in dynamoelectric machines.

Accordingly, it is an object of this invention to provide improved apparatus for monitoring arcing of brushes in a dynamoelectric machine.

Another object of the invention is to provide simple brush monitoring apparatus which will continuously detect brush arcing signals, including low amplitude brush arcing signals, in a composite signal which also contains high-amplitude noise spikes in the same frequency band as the brush arcing signals.

A further object of the invention is to provide a brush monitor which will continuously detect brush arcing signals over a wide range of ambient temperatures.

A still further object of the invention is to provide a brush arc monitor which, in addition to achieving the above objects, will automatically compensate for changes in generator noise level.

SUMMARY OF THE INVENTION

Apparatus is provided for monitoring a composite signal received from generator brushes and for detecting therein high-frequency (RF) signal components indicative of brush arcing. In a preferred embodiment, the invention comprises a brush monitor capable of accurately detecting brush arcing signals even of very low amplitudes in a composite signal which also includes high-amplitude noise spikes in the same high-frequency band as the brush arcing signals. The brush arc monitor includes a filter for removing from the composite signal any low-frequency components such as power frequency ripple which are present, and a clipping network which removes from the composite signal all components above a preselected amplitude. For low-amplitude arcing, the clipping network thus artificially raises the brush arcing/noise amplitude ratio to levels where the masking effect of the noise is greatly mitigated without eliminating a portion of the sampling interval as would blocking or gating out of noise spikes. Also provided in a preferred embodiment of the monitor are temperature-compensated diode discriminators responsive to filtered and clipped signals from positive and negative brushes of a generator to select for further processing only the positive signal of greater magnitude; means for amplifying and then integrating the selected signal; and an alarm network adapted to compare the integrated signal with a predetermined reference signal and indicate the presence of brush arcing when the reference signal is exceeded. A noise generator is also provided to allow testing of a portion of the brush monitor circuitry, and the monitor may include means for automatically adjusting the reference signal level for changes in generator noise due, for example, to changes in load.

BRIEF DESCRIPTION OF THE DRAWINGS

While the specification concludes with claims particularly pointing out and distinctly claiming the subject matter of the invention, the invention will be better understood from the following description taken in connection with the accompanying drawings in which:

FIGS. 3a and 3b are schematics of a preferred embodiment of the invention; and

DETAILED DESCRIPTION OF THE INVENTION

Figure 1:
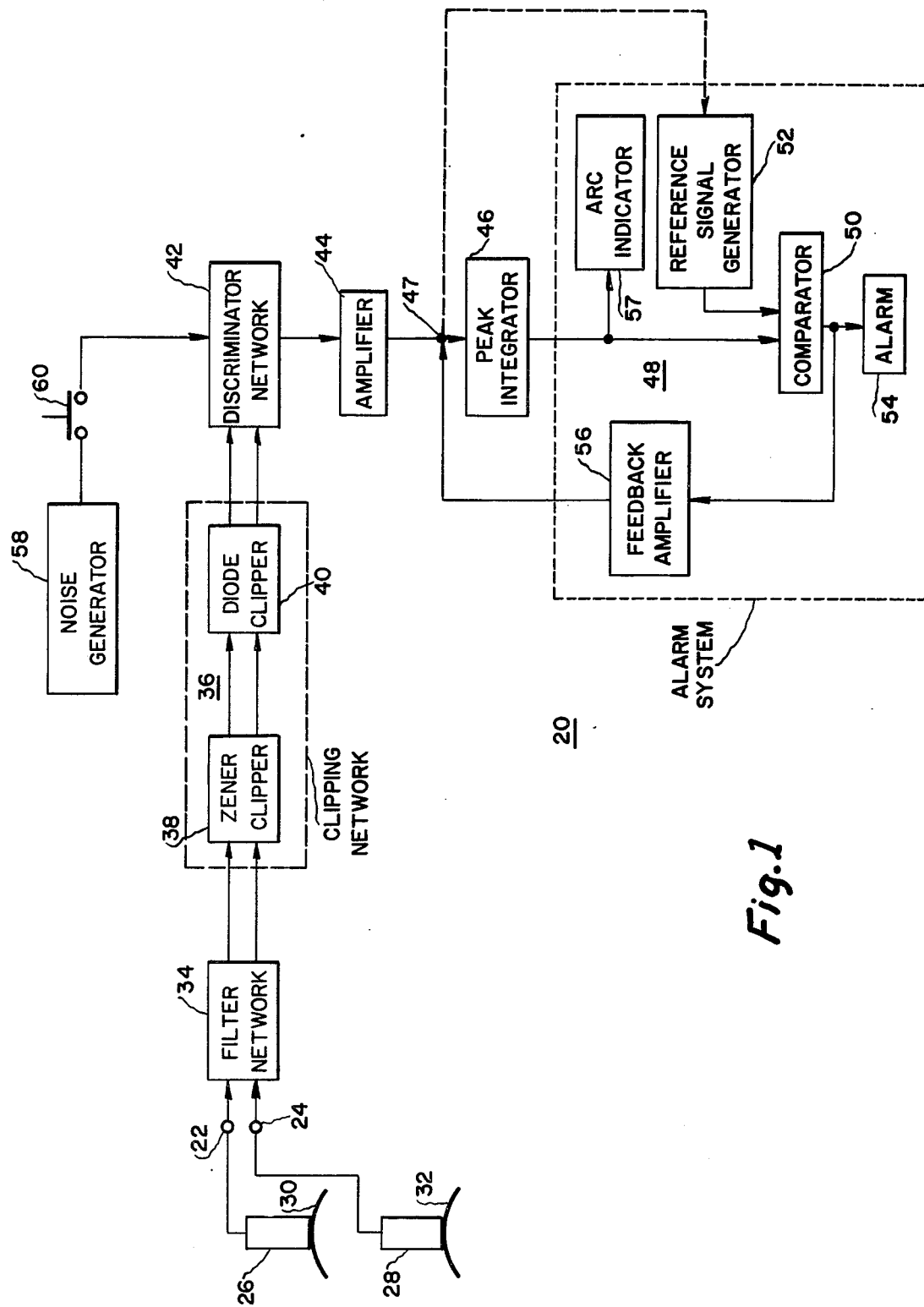
FIG. 1 is a block diagram of a preferred embodiment of the invention.
Figure 2A:
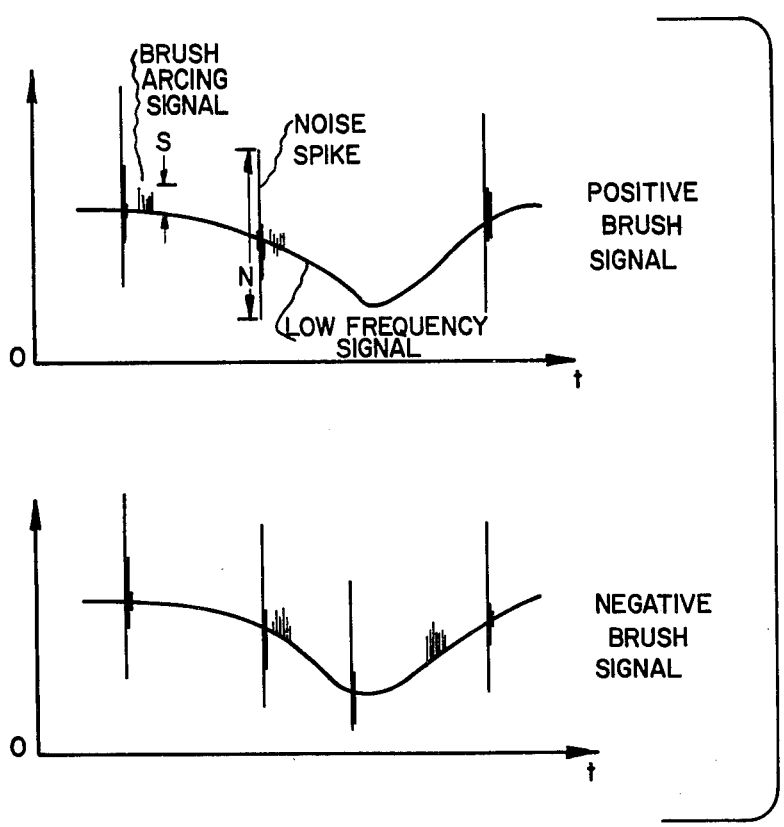
FIGS. 2a–2f are sketches of signals from the brushes of a dynamoelectric machine at various points of an operative preferred embodiment of the invention.
Figure 2B:
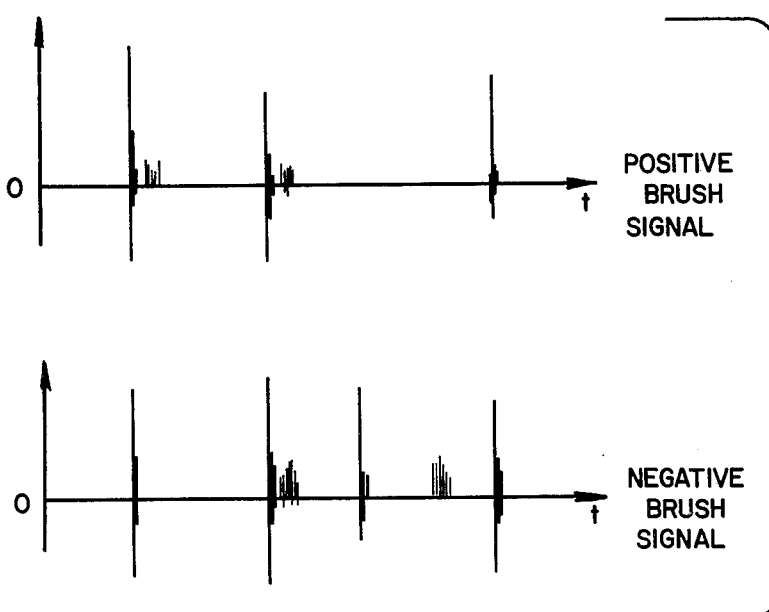
Figure 2C:
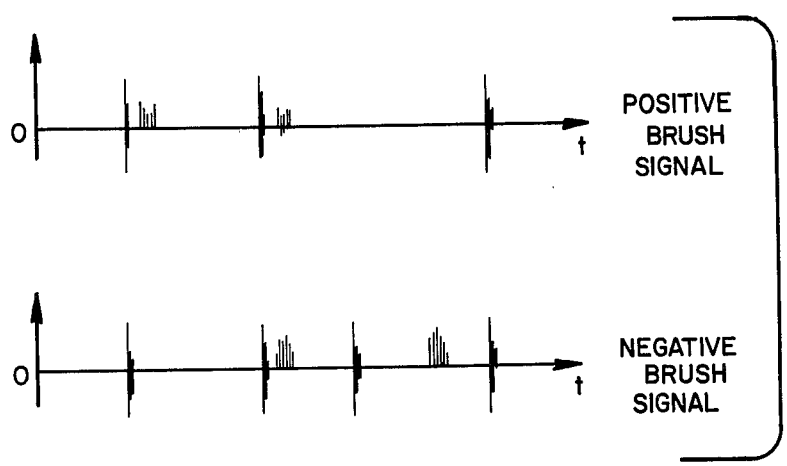
Figure 2D:
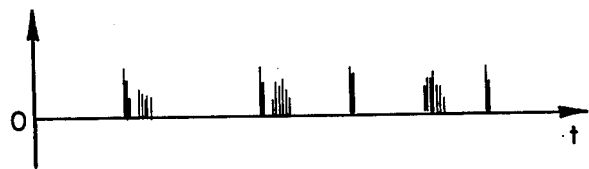

In the block diagram of the preferred embodiment of the invention shown in FIG. 1, the monitoring apparatus or brush arc monitor 20 includes inputs 22 and 24 for receiving composite signals from positive and negative brushes 26 and 28, each of which may comprise a plurality of brushes connected in parallel and which during operation bear in a conventional manner against rotating collector slip rings 30 and 32 of the generator, the remainder of which is not shown. FIG. 2a illustrates a time trace of composite signals from brushes 26 and 28 as received at inputs 22 and 24. A composite signal includes, in addition to inherent noise of the generator system, whose signals are not shown in FIG. 2a in the interest of clarity, three components or individual signals: (1) the brush arcing signal of interest, typically a high-frequency signal; (2) high-amplitude noise spikes in the same high-frequency band as the brush arcing signals and caused, for example, by recurring switching of diodes used in rectifying the excitation voltage supplied to the generator; and (3) low-frequency signals including power frequency ripple, which is susceptible to removal by filtering. As indicated in FIG. 2a, a brush arcing signal whose detection is required to warn of, and prevent, damage to collector slip rings 30 and 32 and other generator components, may have an amplitude S (with respect to the low-frequency signal on which it rides) very low in comparison to the amplitude N of a typical noise spike, e.g., the brush arcing signal and noise spike may have a signal-to-noise (S/N) ratio of as low as 0.0001–0.0002 at inputs 22 and 24 (the signal amplitudes in FIGS. 2a–2f are not to scale). Separation of brush arcing signals from the noise spikes, whose large amplitude masks and therefore hinders accurate detection of brush arcing signals at these low values of S/N, is in general not possible by filtering because the brush arcing signals and noise spikes both appear in the same frequency band. Moreover, since it has been found that low level brush arcing occurs in random bursts rather than in a continuous manner as had previously been thought, some arcing signals may, as illustrated in FIG. 2a, be located near noise spikes or their ringing and thus not be detectable by a system such as that of U.S. Pat. Nos. 3,653,019 or 4,058,804 which in order to remove the noise spikes "gates out" the entire composite signal for a significant portion of the total available sampling interval.

Brush monitor 20 of the present invention, however, mitigates the effect of the noise spikes without this undesirable loss of sampling time and risk of non-detection of arcing signals by providing means for artificially raising the signal-to-noise (S/N) ratio of the brush arcing and noise components by clipping or removing from the composite signal all signal components above a preselected amplitude, thus significantly lowering the noise spike amplitude N so that brush arcing signals are separable therefrom. The monitor further processes the filtered and clipped composite signal in networks which amplify and integrate portions of the signal, and then compare the resulting signal with a reference or residual noise signal.

As is indicated in the block diagram of FIG. 1, the composite signals received at inputs 22 and 24 of brush monitor 20 from brushes 26 and 28 are fed to filter network 34 which removes the low-frequency signals, and the resulting signal enters clipping network 36. In a preferred embodiment of the invention, clipping network 36 includes a first clipper such as Zener clipper 38 which removes all signal components with amplitudes above a first preselected level such as 10 volts, and in series therewith a second clipper such as diode clipper 40, which removes all signal components with amplitudes between a second preselected level (e.g., a value in the range from 2–5 volts) and the first preselected level. The filtered and clipped signals have noise spikes and brush arcing signals whose amplitudes N' and S' are less than or equal to the second preselected clipping level (for low level brush arcing of primary interest, S=S') and have signal-to-noise (S'/N') ratios greater than about 0.005 for all brush arcing signal amplitudes S of interest. The filtered and clipped signals are applied to discriminator network 42, which at each instant of time passes the signal of larger magnitude to amplifier 44. Adjustable gain high-frequency amplifier 44 produces an amplified signal which is applied to peak integrator 46 which acts as a filtered half-wave rectifier to produce a DC integrated signal proportional to the peak amplitude of the amplified signal. The broken line connection from point 47 at the output of amplifier 44 to reference signal generator 52 of alarm system 48 is indicative of a signal path included in those embodiments of brush arc monitor 20 wherein means are provided to automatically adjust reference signals used in alarm system 48 for changes in noise level such as occur when generator load is varied. This feature is described more fully below in connection with the embodiment illustrated in FIG. 4.

Alarm system 48 of brush monitor 20 provides means for comparing the signal from peak integrator 46 with a reference signal and for generating an alarm signal if the reference signal is exceeded. In the preferred apparatus illustrated in the block diagram of FIG. 1, alarm system 48 includes comparator 50 for receiving the integrated signal from peak integrator 46 and a reference signal produced in reference signal generator 52, the reference signal being indicative of integrated noise spikes plus integrated inherent noise in the generator system—i.e., equal to the output of peak integrator 46 without any brush arcing signal component—plus a threshold increment of signal provided to prevent triggering of an alarm due to transients or the variation of integrator output signal about its average level of inherent noise or due to arcing signals considered too low to be of concern. Alarm system 48 also includes alarm 54 to provide an audible and/or visible signal in response to an alarm signal produced by comparator 50 when the integrated signal exceeds the reference signal, indicating the occurrence of brush arcing; feedback amplifier 56, which amplifies the alarm signal to generate, in cooperation with peak integrator 46 to whose input the amplified alarm signal is applied, a large step change in the integrated signal; and arc indicator 57, which may be a meter or chart recorder to provide a visual and/or permanent record of the occurrence of brush arcing.

To permit testing of brush monitor 20 without actually inducing arcing of brushes 26 and 28, noise generator 58 is provided. Noise generator 58, when coupled to discriminator 42 by the closure of switch 60, applies high-frequency signals similar to low level brush arcing to discriminator network 42 and, provided brush monitor 20 is functioning properly, will result in activation of alarm 54 and arc indicator 57.

Figure 3A:
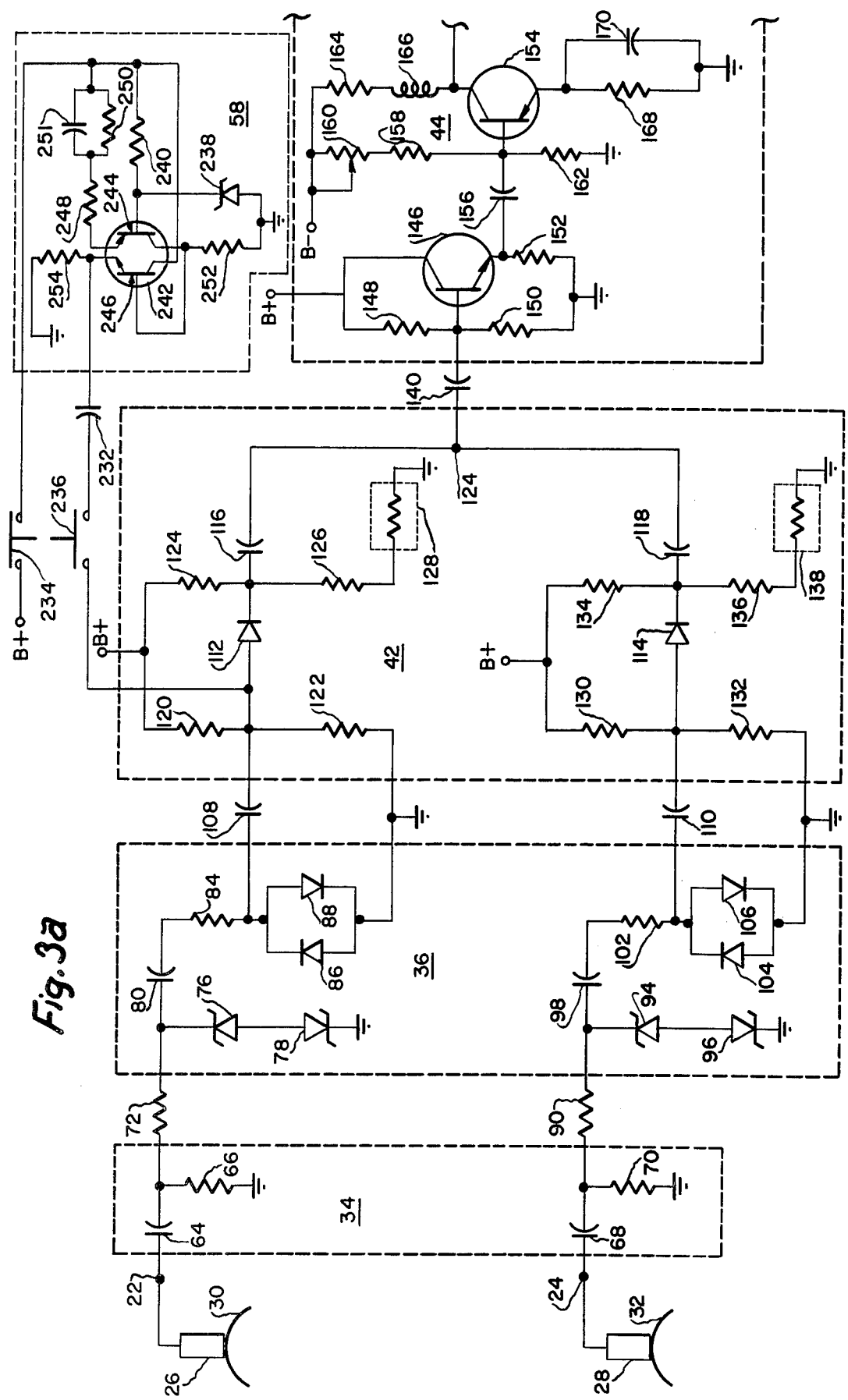

A detailed schematic of the preferred embodiment illustrated in FIG. 1 is given in FIG. 3 wherein all points marked B+ are connected by a common bus line (not shown) to a positive regulated DC voltage supply, and all points marked B— are connected by a common bus line (not shown) to a negative regulated voltage supply. The composite signal from positive brush 26 is received at input 22 of monitor 20 and passes through a high pass filter including capacitor 64 and resistor 66 which removes undesired low-frequency components from the signal and produces a filtered signal which is illustrated in the positive brush wave shape of FIG. 2b. Similarly, the composite signal from negative brush 28 has low-frequency components removed therefrom in passing through capacitor 68 and resistor 70, which together with capacitor 64 and resistor 66 comprise filter network 34. The filtered signal from positive brush 26 is applied through current limiting resistor 72 to clipping network 36, which includes a Zener clipper comprising oppositely poled series-connected Zener diodes 76 and 78, and then is applied through capacitor 80 to a diode clipper comprising resistor 84 and parallel-connected, connected, oppositely poled diodes 86 and 88. These clippers perform a double-clipping action which eliminates from the filtered signal all positive and negative components with amplitudes above a prescribed level, resulting in a filtered and clipped signal (FIG. 2c) which, in contrast to an unprocessed composite signal at monitor input 22 with very low brush arcing/noise spike amplitude ratio (S/N), has greatly reduced noise spike amplitudes N' and hence greatly enhanced values of S'/N'. A parallel signal path and similar clipping means are provided for the filtered signal from negative brush 28, which is applied through current limiting resistor 90 to a Zener clipper comprising Zener diodes 94 and 96 and then through capacitor 98 to a diode clipper comprising resistor 102 and diodes 104 and 106. Clipping network 36, in addition to raising the S/N ratio to levels required for accurate detection of low level arcing, also protects the monitor circuitry following clipping network 36 from possible damage due to high energy signals.

The filtered and clipped signals from the diode clippers are passed through capacitors 108 and 110 respectively to discriminator network 42 which includes diodes 112 and 114; these diodes in turn are connected through capacitors 116 and 118 to a common junction 124. The anode of diode 112 is connected to forward-biasing resistors 120 and 122 and the cathode to reverse-biasing resistors 124, 126, and 128, and a similar arrangement of biasing resistors is provided for diode 114 in the form of resistors 130, 132, 134, 136, and 138. Resistors 128 and 138 are preferably silicon resistors or sensistors (commercially available from, for example, Texas Instruments Incorporated, Dallas, Tex.) with a temperature coefficient of resistance of approximately 0.7 ohms/° C. over an ambient temperature range of about −60° C. to +150° C. In the embodiment of the monitoring apparatus shown in FIG. 2, silicon resistors 128 and 138 are operable to apply a temperature-varying reverse bias to diodes 112 and 114 to compensate for the change in inherent threshold potential of these diodes of approximately 2 millivolts/° C. and thus to maintain constant threshold sensitivity and arc detection accuracy despite changes in ambient temperature of the brush monitor.

Within discriminator network 42, diodes 112 and 114 act to block passage of negative signals to ensure that no cancellation of signals of opposite sign occurs at junction 124, and they also allow only the filtered and clipped signal of greater magnitude at any given time to pass to junction 124 and then through capacitor 140 to amplifier 44. An example of a wave shape appearing at junction 124 is given in FIG. 2d.

To amplify the signals received at junction 124, and particularly the brush arcing components thereof, these signals are fed to high-frequency amplifier 44, which comprises a common emitter amplifier connected between two emitter followers. Transistor 146 forms part of a first emitter follower which also includes bias resistors 148 and 150 and emitter resistor 152 and which acts as a buffer or impedance transfer means between discriminator network 42 and a common emitter amplifier which includes transistor 154. The signal from junction 124 is applied to the base of transistor 146, then appears essentially unchanged in voltage at the emitter thereof, and is fed through capacitor 156 to the base of transistor 154. Transistor 154 is part of a common emitter amplifier which also comprises bias resistor 158 and potentiometer 160 connected between the B— bus line and the base of transistor 154, bias resistor 162 connected between the base of transistor 154 and ground, resistor 164 and inductor 166 connected between the B— bus line and the collector of transistor 154, and resistor 168 and capacitor 170 connected in parallel between the emitter of transistor 154 and ground. Potentiometer 160 permits adjustment of the gain of transistor 154, while inductor 166 is included to help assure adequate high-frequency response of transistor 154, and capacitor 170 acts to produce, for a given setting of potentiometer 160, a gain which is frequency-dependent, i.e., higher for higher frequency signal components input to transistor 154.

Figure 2E:

The resulting amplified signal, which is illustrated in the wave shape of FIG. 2e, includes brush arcing and noise spike signals which may have both positive and negative components. Also, in the example shown in FIG. 2e these amplified components reflect a further improvement in signal-to-noise (S/N) ratio due to the saturation and frequency-dependent gain characteristics of transistor 154 (gain affects S/N because the brush arcing signals generally have somewhat higher frequencies than the noise components even though both signal components are present in the same high-frequency band (e.g., 50 kilohertz - 2 megahertz).

Figure 2F:
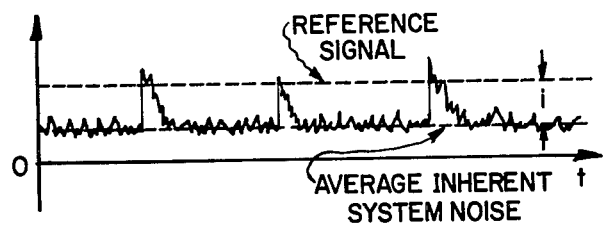

The amplified signal from the emitter of transistor 154 is fed through coupling capacitor 172 to the base of transistor 174 which is part of an emitter follower connected between the B+ and B— bus lines and which also includes bias resistors 176 and 178 and emitter resistor 180. The emitter follower of which transistor 174 is a part is included in amplifier 44 to prevent loading of the collector of transistor 154. The amplified signal is then coupled through capacitor 182 to peak integrator 46, which includes diode 184, resistor 186 and capacitor 188 connected in parallel between the cathode of diode 184 and ground, and resistor 190 and diode 192 connected in parallel between the anode of diode 184 and ground. Peak integrator 46 functions in a manner similar to a filtered half-wave rectifier to produce a time-varying DC output signal as illustrated in FIG. 2f whose amplitude is proportional to the peak amplitude of the signal from amplifier 44. In FIG. 2f the integrated signal is shown as having a sawtooth pattern whose amplitude varies by relatively small amounts about a nearly constant level equal to the average inherent noise of the generator system (whose individual signals have been omitted from FIGS. 2a–2e for clarity) plus a number of step changes which are due to brush arcing. The contribution due to noise spikes is not apparent in FIG. 2f as separate components since the energy possessed by the spikes is insufficient to fully charge capacitor 188 of peak integrator 46 and contribute significantly to the integrator output, as contrasted with the brush arcing components which are seen by peak integrator 46 as signal bursts of relatively longer duration and greater total energy. Also shown in FIG. 2f is the threshold increment i such as one volt by which the reference signal is set above the average inherent noise level so as to prevent spurious alarms.

The output of peak integrator 46 is directed to arc indicator 57 of alarm system 48, arc indicator 57 comprising a voltage meter 194 and capacitor 196 connected in parallel and referenced to ground but which may (although not shown) also include a chart recorder to provide a permanent record of integrator output signal. The integrator output signal is also applied through input resistor 198 to high-speed voltage comparator 50. Comparator 50 is also adapted to receive a reference signal from reference signal generator 52, which comprises reference set point network 201 including resistor 202 and series-connected Zener diodes 204 and 206, the diodes in turn connected in parallel with series-connected potentiometers 208 and 210. Potentiometers 208 and 210 provide means for adjusting the level of the reference signal which is applied from the wiper arm of potentiometer 210 through input resistor 212 to comparator 50 so that the reference signal accurately reflects the inherent noise in the generator system and changes in the average level thereof associated with varying levels of generator load.

The output of comparator 50 is connected to alarm 54, which includes audible alarm 216 and light-emitting diode (LED) alarm 218 which are activated by an alarm signal from comparator 50 when brush arcing of a sufficient level occurs such that the peak integrator output signal applied to comparator 50 exceeds the reference signal applied thereto. Switch 220 connected between the output of comparator 50 and audible alarm 216 is included so that by the opening thereof audible alarm 216 may be disconnected from monitor 20 and rendered inoperative. The output of comparator 50 is also connected to a current dividing network including series-connected resistors 222 and 224 arranged in parallel with LED alarm 218 and audible alarm 216 to provide multiple signal paths so that if either alarm 216 or 218 (or both) fails, as by shorting, the alarm signal from comparator 50 will still activate the remaining operative alarm or arc indicator 57. The output of comparator 50 is also referenced to ground through capacitor 226 and coupled by capacitor 228 to feedback amplifier 56, which comprises transistor 230 arranged in a common emitter amplifier configuration with its collector connected to ground through resistor 232 and its emitter connected to the B+ bus line through resistor 234. An alarm signal applied to the base of transistor 230 from the output of comparator 50 will appear in amplified form at the collector of transistor 230 and be fed back through resistor 235 to the input of peak integrator 46, resulting in a large step change to the integrator output signal and a readily apparent indication of arcing as displayed on voltage meter 194.

Noise generator 58, which may be coupled to the B+ bus line and through capacitor 232 to discriminator network 42 by the closure of switch contacts 234 and 236, is included to permit testing of monitor 20 (except for filter network 34 and clipping network 36). High-frequency (RF) noise is generated by a Zener diode 238 biased near the knee portion of its characteristic curve by means of resistor 240 connected to the cathode thereof. The cathode of Zener diode 238 is also connected to dual oscillator 242 comprising transistor 244 connected in a common emitter amplifier configuration and transistor 246 connected in an emitter follower configuration. The noise from Zener diode 238 is amplified in transistor 244, whose emitter is connected to B+ bus line through resistor 248 and, in series therewith, parallel-connected resistor 250 and capacitor 251, and whose collector is connected to ground through resistor 252. The amplified noise appearing at the collector of transistor 244 is applied to the base of transistor 246 and passes from the emitter thereof, which is connected to ground through resistor 254, through capacitor 232 and switch contacts 236 to discriminator network 42 and on through the monitor circuitry to activate alarm 54 and arc indicator 57.

Figure 4:
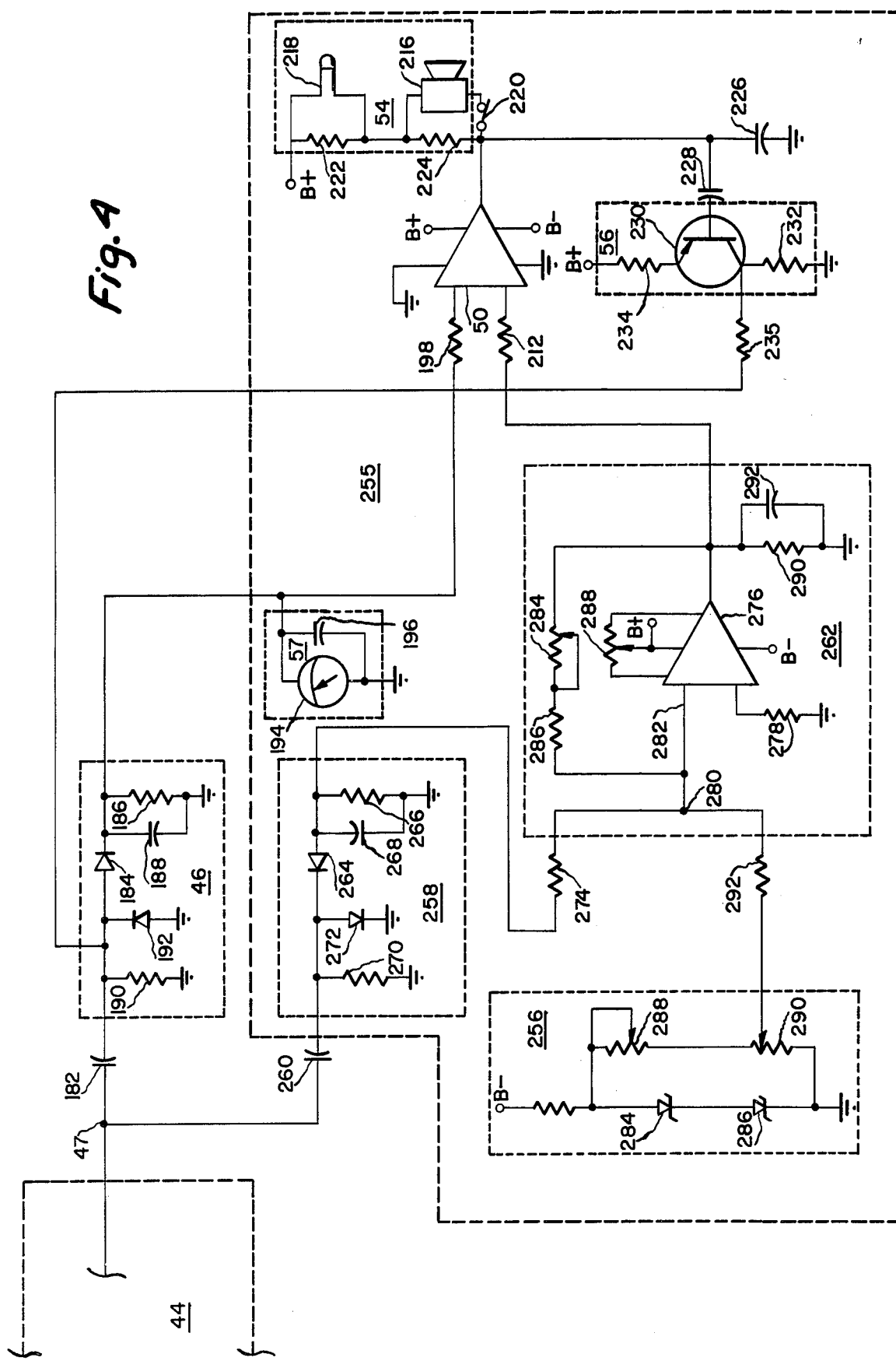
FIG. 4 is a schematic of the alarm system of another embodiment of the brush arc monitor illustrating features for automatically adjusting the level of reference signal for changes in generator noise.

FIG. 4 shows the alarm system 255 of an embodiment of brush monitor 20 wherein means are provided for automatically adjusting the level of the reference signal applied to comparator 50 for changes in average level of system noise at brushes 26 and 28 such as occur when generator load is varied. To accomplish this automatic compensation, the reference signal generator of the embodiment shown in FIG. 4 includes in addition to reference set point network 256, which is similar (except for diode direction and bus line voltage) to network 201 of FIG. 3, a peak integrator 258 connected through capacitor 260 to point 47 at the output of amplifier 44, and summing amplifier network 262 connected between reference network 256 and comparator 50. Summing amplifier network 262 combines the integrated signal from integrator 258, whose magnitude is indicative of a level of system noise whose average level may vary with time, with a reference set point signal whose magnitude is equal to the preset threshold increment by which the output signal from integrator 46 (system noise plus brush arcing) must exceed the average level of system noise in order to activate comparator 50, thus producing a reference signal which automatically adjusts for noise level changes.

Peak integrator 258 includes diode 264, resistor 266 and capacitor 268 connected in parallel between the anode of diode 264 and ground, and resistor 270 and diode 272 connected between the cathode of diode 264 and ground, and functions in a manner similar to a filtered half-wave rectifier, i.e., like peak integrator 46. However, since in the embodiment shown in FIG. 4 summing amplifier network 262 inverts as well as combines the signals input thereinto, diodes 264 and 272 of integrator 258 are oriented to produce a negative integrated signal. In addition, resistor 266 and capacitor 268 are selected so as to provide integrator 258 with a time constant somewhat longer (e.g., by a factor of 10) than that of integrator 46 so that integrator 258 will absorb or at least delay passage therethrough of signal changes associated with short bursts of brush arcing which it is desired not be quickly reflected as changes in the level of reference signal applied to comparator 50.

The output signal from peak integrator 258 is applied through resistor 274 to summing amplifier network 262. Amplifier network 262 includes operational amplifier 276 which has one input referenced to ground through resistor 278 and a second input connected to point 280 to receive through input line 282 the integrated signal from integrator 258 and a signal from reference set point network 256. Network 256, which comprises Zener diodes 284 and 286 connected in series between the B− bus line and ground and in parallel with series-connected potentiometers 288 and 290, furnishes a set point signal through resistor 292 to point 280 which is equal in magnitude to the threshold increment of signal at which comparator 50 is activated (such as 1 volt) and of negative sign because of the invert characteristic of operational amplifier 276. Amplifier 276 changes the sign and adds the set point and integrated signal input thereto through line 282, producing a reference signal for application to comparator 50 through resistor 212 which automatically adjusts to changes in generator noise level reflected in the output of peak integrator 258. The unitary gain of operational amplifier 276 is held by adjusting potentiometer 284 provided in a feedback loop which also includes resistor 286. Also provided in amplifier network 262 are potentiometer 288 connected between the B+ line and two terminals of amplifier 276 and used for amplifier nulling adjustments, and resistor 290 and capacitor 292 connected in parallel at the output of amplifier 276 to provide a path to ground for noise inherent in amplifier 276.

Operation of brush monitor 20 may be readily understood from the following review of the steps by which composite signals from brushes 26 and 28 are processed by the preferred embodiment of the invention illustrated in FIGS. 1 and 3. Composite signals received at inputs 22 and 24 are first filtered to eliminate low-frequency signals such as 60 hertz power-generating components and their harmonics, then clipped once by Zener clipper 38 of clipping network 36 and a second time by diode clipper 40. If brush arcing signals of amplitude S are present in the composite signal together with noise spikes of amplitude N, and S is quite low compared to N, the double clipping action raises the signal-to-noise (S/N) ratio appreciably by removing the high-amplitude portion of the noise spikes from the composite signal without altering the arcing signals.

The filtered and clipped signals are directed to discriminator network 42 wherein diodes 112 and 114 block passage of negative signals to prevent cancellation of signals of opposite sign (which might otherwise occur upon the combining of signals from positive brush 26 and negative brush 28) and allow the signal of greater magnitude at any given time to pass to junction 124 and into amplifier 44. This signal, which includes clipped noise spikes and brush arcing signal components, is fed through transistor 146, amplified by transistor 154, and passes through transistor 174 into peak integrator 46. Peak integrator 46 produces from the amplified signal a DC output signal which is applied to one input of comparator 50. A reference signal is applied from reference signal generator 52 to a second input of comparator 50. The level of reference signal for different generator loadings may be predetermined from prior measurements and adjusted manually by varying the settings of potentiometers 208 and 210 of reference set point network 201 or may be automatically adjusted by means of the arrangement shown in FIG. 4 wherein the amplified signal from point 47 is also fed through peal integrator 258, and the integrated signal from integrator 258 is combined with a set point signal from network 256 in operational amplifier 276 to form a reference signal which adjusts automatically for changes in generator noise level.

When the DC output signal from peak integrator 46 exceeds the reference signal applied to comparator 50 through resistor 212, comparator 50 is activated and produces an alarm signal at its output. The alarm signal triggers audible alarm 216 and LED alarm 218 and is amplified by transistor 230 in feedback amplifier 56. The amplified alarm signal is fed back to the input of peak integrator 46; producing a large step change in the peak integrator output signal and a readily apparent and recordable indication of brush arcing in arc indicator 57.

It should be apparent to those skilled in the art that the above-described simplified brush monitor can be used to accurately monitor brush arcing of different amplitude levels and in both AC and DC generators over a wide range of power ratings. Although the brush monitor of the invention is particularly useful in providing increased accuracy over prior art devices in detecting brush arcing signals of low amplitudes and arcing signals which occur very close in time to high-amplitude noise spikes, the monitor will also accurately detect arcing in generators without noise spikes and arcing of high amplitude in all types of generators with brushes. For arcing signals of sufficient amplitude to be affected by clipping network 36, whose occurrence is unlikely since strong arcing signals normally would be preceded by low-amplitude brush arcing which would be detected by the monitor and eliminated by the taking of corrective action, clipping of high-amplitude arcing signals would either raise their S/N ratio or leave unchanged values thereof more than adequate for detecting the presence of brush arcing.

While the invention has been described in detail with reference to specific preferred embodiments, it is understood that various modifications will be apparent to those skilled in the art of brush monitoring systems. For example, for certain monitoring applications it may be desirable to include within monitor 20 means for rectifying the filtered and clipped signal prior to its passage into discriminator 42 so that negative components of arcing which could occur would be detected and not blocked by discriminator 42 as in the preferred embodiment illustrated in FIG. 3. It is intended to to claim all such modifications which fall within the true spirit and scope of the present invention.

What is claimed is:

1. Apparatus for monitoring arcing of brushes in a generator wherein said arcing may be masked by high-amplitude noise spikes produced by solid-state switching devices in the excitation system of said generator, said apparatus comprising:

signal receiving means for receiving from a generator brush a composite signal including a brush arcing signal of amplitude S, a noise spike of amplitude N, and a low-frequency signal, said brush arcing signal and said noise spike occurring in the same high-frequency band and having a signal-to-noise ratio, S/N, which may be so low that said noise spike substantially masks said brush arcing signal from accurate detection;

a filter for removing said low-frequency signal from said composite signal;

a clipping network for removing from said composite signal all components above a preselected amplitude to provide a clipped signal with S'/N' ratio at least equal to a preselected value, where S' and N' are respectively the amplitude of said brush arcing signal and said noise spike after their passage through said clipping network;

an amplifier responsive to said filtered and clipped composite signal to produce an amplified signal;

an integrator connected to said amplifier and operable to produce an integrated signal in response to said amplified signal; and an alarm system operable to compare said integrated signal with a reference signal and to produce an alarm signal when said integrated signal exceeds said reference signal.

2. The monitoring apparatus of claim 1 wherein said clipping network is adapted to provide a clipped signal with an S'/N' ratio greater than 0.005.

3. The monitoring apparatus of claim 1 wherein said clipping network comprises two series-connected diode networks operative to remove all components of said composite signal above two volts.

4. The monitoring apparatus of claim 1 wherein said signal receiving means, and filter, and said clipping network each include a first signal path for processing a composite signal from a positive brush and a second signal path in parallel with said first signal path for processing a composite signal from a negative brush, and said monitoring apparatus further comprises a discriminator network, said discriminator network including first and second discriminator diodes adapted to block negative components of said filtered and clipped composite signals from passage to said amplifier, and further including means for connecting the output of each of said diodes to said amplifier such that at any given time during operation of said monitoring apparatus only the positive filtered and clipped signal component of greater amplitude is passed to said amplifier.

5. The monitoring apparatus of claim 4 wherein said discriminator network includes means for applying bias to said diodes such that the threshold potential of each of said diodes remains substantially constant over an ambient temperature range from about −60 to +150 degrees Celsius.

6. The monitoring apparatus of claim 5 wherein said means for applying bias to each of said diodes includes a silicon resistor whose resistance varies substantially linearly with temperature.

7. The monitoring apparatus of claim 1 wherein said alarm system comprises:

a reference signal generator for producing an adjustable reference signal;

a comparator having a first input connected to said integrator, a second input connected to said reference signal generator, and an output adapted to provide an alarm signal when said integrated signal exceeds said adjustable reference signal; and an alarm connected to said comparator output.

8. The monitoring apparatus of claim 7 further including:

a feedback amplifier connected between said comparator output and the input of said integrator; and an arc indicator connected to said peak integrator and adapted to provide a readily apparent and recordable indication of brush arcing in response to an alarm signal applied to said feedback amplifier.

9. The monitoring apparatus of claim 7 wherein said alarm includes an audible alarm, a light-emitting diode alarm, and a resistor network arranged in parallel with said audible alarm and said light-emitting diode alarm to provide multiple signal paths for fail-safe operation of said alarm system.

10. The monitoring apparatus of claim 7 wherein said reference signal generator includes means for automatically adjusting said reference signal to accommodate changes in inherent noise level of said generator brushes.

11. The monitoring apparatus of claim 10 wherein said means for automatically adjusting the reference signal comprises:

a peak integrator connected to said amplifier and adapted to produce an integrated signal;

means for producing a reference set point signal; and a summing amplifier network operable to combine the integrated signal from said peak integrator with the reference set point signal to produce an adjusted reference signal.

* * * * *